(12) United States Patent
Iwazaki et al.

(10) Patent No.: US 10,420,223 B2
(45) Date of Patent: Sep. 17, 2019

(54) METHOD FOR MANUFACTURING SUBSTRATE FOR POWER MODULE WITH HEAT SINK

(71) Applicant: MITSUBISHI MATERIALS CORPORATION, Tokyo (JP)

(72) Inventors: Wataru Iwazaki, Kumagaya (JP); Masahito Komasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/562,120

(22) PCT Filed: Feb. 16, 2016

(86) PCT No.: PCT/JP2016/054435
§ 371 (c)(1),
(2) Date: Sep. 27, 2017

(87) PCT Pub. No.: WO2016/158046
PCT Pub. Date: Oct. 6, 2016

(65) Prior Publication Data
US 2018/0084650 A1  Mar. 22, 2018

(30) Foreign Application Priority Data

Mar. 30, 2015 (JP) .................................. 2015-069860

(51) Int. Cl.
*H05K 3/36* (2006.01)
*H01L 23/12* (2006.01)
(Continued)

(52) U.S. Cl.
CPC ........... *H05K 3/363* (2013.01); *C04B 35/645* (2013.01); *C04B 37/026* (2013.01); *H01L 23/12* (2013.01);
(Continued)

(58) Field of Classification Search
CPC ..... H05K 1/0201; H05K 1/0203; H05K 7/209
See application file for complete search history.

(56) References Cited

U.S. PATENT DOCUMENTS 6,033,787 A     3/2000  Nagase et al.
2013/0010429 A1*  1/2013  Tonomura ........... H01L 23/3735
                                                361/720
(Continued)

FOREIGN PATENT DOCUMENTS

CN    102651348 A    8/2012
JP    10-65075 A     3/1998
(Continued)

OTHER PUBLICATIONS

International Search Report dated Apr. 19, 2016, issued for PCT/JP2016/054435 and English translation thereof.
(Continued)

*Primary Examiner* — Marc Anthony Armand
(74) *Attorney, Agent, or Firm* — Locke Lord LLP; James E. Armstrong, IV; Nicholas J. DiCeglie, Jr.

(57) ABSTRACT

In an aluminum material that constitutes a bonding surface of a metal layer, and an aluminum material that constitutes a bonding surface of a heat sink, any one aluminum material is set to a high-purity aluminum material with high aluminum purity, and the other aluminum material is set to a low-purity aluminum material with low aluminum purity. The difference in a concentration of a contained element other than Al between the high-purity aluminum material and the low-purity aluminum material is set to 1 at % or greater, and the metal layer and the heat sink are subjected to solid-phase diffusion bonding.

6 Claims, 5 Drawing Sheets

(51) Int. Cl.
- *H01L 23/36* (2006.01)
- *H01L 25/07* (2006.01)
- *H01L 25/18* (2006.01)
- *H01L 23/14* (2006.01)
- *H05K 1/02* (2006.01)
- *C04B 35/645* (2006.01)
- *C04B 37/02* (2006.01)

(52) U.S. Cl.
CPC ............ *H01L 23/142* (2013.01); *H01L 23/36* (2013.01); *H01L 25/07* (2013.01); *H01L 25/18* (2013.01); *H05K 1/0203* (2013.01); *C04B 2235/6567* (2013.01); *C04B 2235/6581* (2013.01); *C04B 2235/6582* (2013.01); *C04B 2235/963* (2013.01); *C04B 2237/121* (2013.01); *C04B 2237/128* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/704* (2013.01); *C04B 2237/706* (2013.01); *H01L 2224/32225* (2013.01)

(56) References Cited

U.S. PATENT DOCUMENTS

| | | |
|---|---|---|
| 2013/0335921 A1 | 12/2013 | Nagatomo et al. |
| 2015/0282379 A1 | 10/2015 | Terasaki et al. |
| 2015/0366048 A1 | 12/2015 | Nagase et al. |

FOREIGN PATENT DOCUMENTS

| | | |
|---|---|---|
| JP | 2007-250638 A | 9/2007 |
| JP | 2008-016813 A | 1/2008 |
| JP | 2013-229564 A | 11/2013 |
| JP | 2014-060215 A | 4/2014 |
| JP | 2014-099596 A | 5/2014 |
| JP | 2014-160799 A | 9/2014 |

OTHER PUBLICATIONS

Office Action (part of Search Report) issued in corresponding Chinese Patent Application No. CN 201680018019.6 dated Jan. 28, 2019.

Extended European Search Report issued in corresponding European Patent Application No. 16771930.1, dated Oct. 18, 2018.

* cited by examiner

FIG. 6

METHOD FOR MANUFACTURING SUBSTRATE FOR POWER MODULE WITH HEAT SINK

TECHNICAL FIELD

The present invention relates to a method for manufacturing a power module substrate with heat sink which includes an insulating layer, a circuit layer that is formed on one surface of the insulating layer, a metal layer that is formed on the other surface of the insulating layer, and a heat sink that is disposed on a surface of the metal layer on a side that is opposite to the insulating layer.

Priority is claimed on Japanese Patent Application No. 2015-069860, filed on Mar. 30, 2015, the content of which is incorporated herein by reference.

BACKGROUND ART

In general, in a power semiconductor element for large power control which is used to control wind power generation, an electric vehicle, a hybrid car, and the like, the amount of heat generation is great. Therefore, as a substrate on which the power semiconductor element is mounted, for example, a power module substrate, which includes a ceramic substrate formed from aluminum nitride (AlN), alumina ($Al_2O_3$), and the like, a circuit layer that is formed on one surface of the ceramic substrate, and a metal layer that is formed on the other surface of the ceramic substrate, has been widely used in the related art.

In addition, a power module substrate with heat sink, in which a heat sink is bonded to the metal layer side, is provided so as to efficiently dissipate heat that is generated from the semiconductor element that is mounted, and the like.

For example, Patent Document 1 discloses a power module substrate with heat sink in which a circuit layer and a metal layer of the power module substrate is constituted by aluminum or an aluminum alloy, the heat sink is constituted by aluminum or an aluminum alloy, and the metal layer and the heat sink are bonded by soldering or brazing.

In addition, Patent Document 2 discloses a power module substrate with heat sink in which a circuit layer and a metal layer which are formed from aluminum are respectively formed on one surface and the other surface of the ceramic substrate, a copper plate is disposed between the metal layer and the heat sink, and the metal layer and the copper plate, and the copper plate and the heat sink are respectively soldered.

In addition, Patent Document 3 discloses a power module substrate with heat sink in which a circuit layer and a metal layer of a power module substrate are constituted by aluminum or an aluminum alloy, and a heat sink is constituted by aluminum or an aluminum alloy. In the power module substrate with heat sink, a bonding material constituted by copper or a copper alloy is interposed between the metal layer and the heat sink, and the metal layer and the bonding material, and the bonding material and the heat sink are respectively subjected to solid-phase diffusion bonding.

CITATION LIST

Patent Literatures

[Patent Document 1] Japanese Unexamined Patent Application, First Publication No. 2008-016813

[Patent Document 2] Japanese Unexamined Patent Application, First Publication No. 2007-250638

[Patent Document 3] Japanese Unexamined Patent Application, First Publication No. 2014-060215

DISCLOSURE OF INVENTION

Technical Problem

However, recently, a high output of a power semiconductor element and the like is in progress, and a strict heat cycle is loaded to a power module substrate with heat sink on which the power semiconductor element is mounted. Accordingly, there is a demand for the power module substrate with heat sink which is more excellent in bonding reliability against the heat cycle in comparison to the related art.

Here, in the power module substrate with heat sink described in Patent Document 1, in a case of soldering the metal layer and the heat sink, there is a problem that cracks occur in solder in the heat cycle load, and a bonding rate decreases.

In addition, in a case of brazing the metal layer and the heat sink, there is a concern that cracking may occur in the ceramic substrate in the heat cycle load.

In addition, in a heat sink having a complicated structure in which a flow passage of a cooling medium and the like are formed at the inside thereof, the heat sink may be manufactured by a casted aluminum alloy of which a solidus temperature is relatively low. However, in the heat sink, it is difficult to perform bonding by using a brazing material.

In the power module substrate with heat sink described in Patent Document 2, since the metal layer and the copper plate, and the copper plate and the heat sink are respectively soldered, there is a problem that cracks occur in solder in the heat cycle load, and the bonding rate decreases.

In addition, in the power module substrate with heat sink described in Patent Document 3, the bonding material constituted by copper or a copper alloy is interposed between the metal layer and the heat sink. The metal layer and the bonding material, and the bonding material and the heat sink are respectively subjected to the solid-phase diffusion bonding. An intermetallic compound is formed on a bonding interface between the metal layer and heat sink. The intermetallic compound is hard and brittle, there is a concern that cracking and the like may occur in the heat cycle load.

The invention has been made in consideration of the above-described circumstances, and an object thereof is to provide a method for manufacturing a power module substrate with heat sink which is capable of manufacturing a power module substrate with heat sink capable of suppressing the occurrence of cracks and the like in a bonding interface even in heat cycle load.

Solution to Problem

To solve the above-described problem and to accomplish the above-described object, according to an aspect of the invention, there is provided a method for manufacturing a power module substrate with heat sink which includes an insulating layer, a circuit layer that is formed on one surface of the insulating layer, a metal layer that is formed on the other surface of the insulating layer, and a heat sink that is disposed on a surface of the metal layer on a side opposite to the insulating layer. A bonding surface with the heat sink in the metal layer and a bonding surface with the metal layer in the heat sink are constituted by an aluminum material including aluminum or an aluminum alloy. In the aluminum material that constitutes the bonding surface of the metal layer, and the aluminum material that constitutes the bonding surface of the heat sink, any one aluminum material is set to a high-purity aluminum material with high aluminum purity, and the other aluminum material is set to a low-purity aluminum material with low aluminum purity. The difference in a concentration of a contained element other than Al between the high-purity aluminum material and the low-purity aluminum material is set to 1 at % or greater, and the metal layer and the heat sink are subjected to solid-phase diffusion bonding.

In the method for manufacturing a power module substrate with heat sink as described above, the bonding surface with the heat sink in the metal layer and the bonding surface with the metal layer in the heat sink are constituted by an aluminum material including aluminum or an aluminum alloy, and the metal layer and the heat sink are subjected to the solid-state diffusion bonding. Typically, in a case of solid-phase diffusion between aluminum materials, a self-diffusion velocity of aluminum is slow, and a long time is necessary to obtain strong solid-phase diffusion bonding. Therefore, it is difficult to industrially realize the solid-phase diffusion bonding.

Here, according to the aspect of the invention, in the aluminum material that constitutes the bonding surface of the metal layer, and the aluminum material that constitutes the bonding surface of the heat sink, any one aluminum material is set to a high-purity aluminum material with high aluminum purity, and the other aluminum material is set to a low-purity aluminum material with low aluminum purity. In addition, a difference in a concentration of a contained element other than Al between the high-purity aluminum material and the low-purity aluminum material is set to 1 at % or greater. According to this, the contained element other than Al is diffused from the low-purity aluminum material side to the high-purity aluminum material side, and thus self-diffusion of aluminum is promoted. As a result, it is possible to reliably subject the metal layer and the heat sink to the solid-phase diffusion bonding in relatively short time.

In addition, since the heat sink and the metal layer are subjected to the solid-phase diffusion bonding, even in heat cycle load, there is no concern that cracking and the like occur in a bonding interface. As a result, it is possible to obtain a power module substrate with heat sink which is excellent in bonding reliability against the heat cycle.

In the method for manufacturing a power module substrate with heat sink according to the aspect of the invention, the high-purity aluminum material and the low-purity aluminum material may contain one kind or two or more kinds of elements selected from Si, Cu, Mn, Fe, Mg, Zn, Ti, and Cr as the contained element other than Al, and a difference between a total amount of the contained element other than Al in the high-purity aluminum material and a total amount of the contained element other than Al in the low-purity aluminum material may be set to 1 at % or greater.

In this case, when considering that the elements such as Si, Cu, Mn, Fe, Mg, Zn, Ti, and Cr are excellent in an operational effect of promoting the self-diffusion of aluminum, it is possible to reliably realize the solid-phase diffusion bonding between the metal layer and the heat sink which are constituted by the aluminum material in short time.

In addition, in the method for manufacturing a power module substrate with heat sink according to the aspect of the invention, the low-purity aluminum material may contain one kind or two or more kinds of elements selected from Si, Cu, Mn, Fe, Mg, Zn, Ti, and Cr in a total amount of 1 at % or greater, the amount of Si contained may be set to 15 at % or less, the amount of Cu contained is set to 10 at % or less, the amount of Mn contained may be set to 2 at % or less, the amount of Fe contained may be set to 1 at % or less, the amount of Mg contained may be set to 5 at % or less, the amount of Zn contained may be set to 10 at % or less, the amount of Ti contained may be set to 1 at % or less, and the amount of Cr contained may be set to 1 at % or less.

In this case, since the low-purity aluminum material with low purity contains one kind or two or more kinds of elements selected from Si, Cu, Mn, Fe, Mg, Zn, Ti, and Cr in a total amount of 1 at % or greater, the elements are diffused to the high-purity aluminum material side, and thus the self-diffusion of aluminum is promoted. As a result, it is possible to reliably realize the solid-phase diffusion bonding between the metal layer and the heat sink in a relatively short time.

On the other hand, since the amount of Si contained is limited to 15 at % or less, the amount of Cu contained is limited to 10 at % or less, the amount of Mn contained is limited to 2 at % or less, the amount of Fe contained is limited to 1 at % or less, the amount of Mg contained is limited to 5 at % or less, the amount of Zn contained is limited to 10 at % or less, the amount of Ti contained is limited to 1 at % or less, and the amount of Cr contained is limited to 1 at % or less, it is possible to suppress the bonding interface from being hard more than necessary due to the elements. As a result, it is possible to reliably manufacture the power module substrate with heat sink which is excellent in bonding reliability against a heat cycle.

In addition, in the method for manufacturing a power module substrate with heat sink according to the aspect of the invention, in a state in which the metal layer and the heat sink are laminated, and a load of 0.3 MPa to 3.0 MPa is applied to the resultant laminated body in a lamination direction, the laminated body may be retained at a temperature that is equal to or higher than 90% of a solidus temperature (K) of the low-purity aluminum material and is lower than the solidus temperature of the low-purity aluminum material for 1 hour or longer to subject the metal layer and the heat sink to the solid-phase diffusion bonding.

In this case, since the solid-phase diffusion bonding conditions, in which in a state in which a load of 0.3 MPa to 3.0 MPa is applied in a lamination direction, the laminated body is retained at a temperature that is equal to or higher than 90% of a solidus temperature (K) of the low-purity aluminum material and is lower than the solidus temperature of the low-purity aluminum material for 1 hour or longer, are employed, it is possible to promote diffusion migration of aluminum. As a result, it is possible to reliably bond together the metal layer and the heat sink.

Advantageous Effects of Invention

According to the aspect of the invention, it is possible to provide a method for manufacturing a power module substrate with heat sink which is capable of manufacturing the power module substrate with heat sink capable of suppressing occurrence of cracks and the like on a bonding interface even in heat cycle load.

BEST MODE FOR CARRYING OUT THE INVENTION

Hereinafter, embodiments of the invention will be described with reference to the accompanying drawings.

Figure 1:
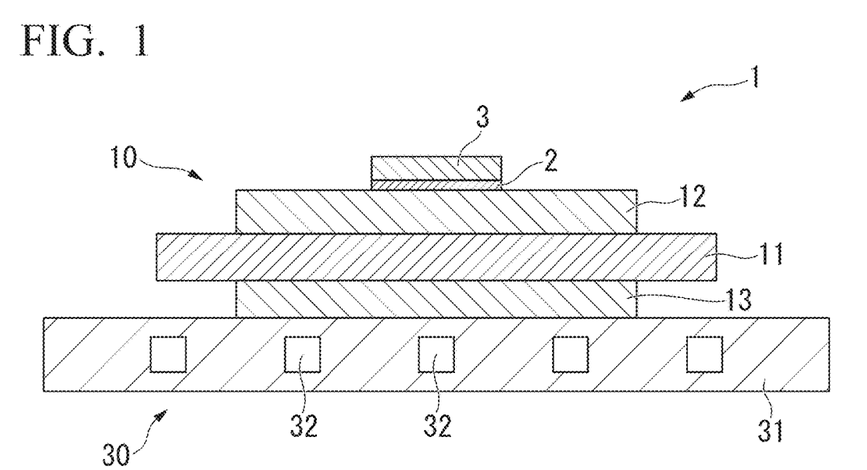
FIG. 1 is a schematic view showing a power module substrate with heat sink and a power module according to an embodiment of the invention.

FIG. 1 shows a power module substrate with heat sink 30 and a power module 1 according to an embodiment of the invention.

The power module 1 includes the power module substrate with heat sink 30, and a semiconductor element 3 that is bonded to one surface (an upper surface in FIG. 1) of the power module substrate with heat sink 30 with a solder layer 2 interposed therebetween.

Here, for example, the solder layer 2 is set to a Sn—Ag-based soldering material, a Sn—In-based soldering material, or a Sn—Ag—Cu-based soldering material.

In addition, the power module substrate with heat sink 30 according to this embodiment includes a power module substrate 10 and a heat sink 31 that is bonded to the power module substrate 10.

The power module substrate 10 includes a ceramic substrate 11, a circuit layer 12 that is arranged on one surface (an upper surface in FIG. 1) of the ceramic substrate 11, and a metal layer 13 that is arranged on the other surface (a lower surface in FIG. 1) of the ceramic substrate 11.

The ceramic substrate 11 is configured to prevent electrical connection between the circuit layer 12 and the metal layer 13, and is constituted by aluminum nitride (AlN) having high insulating properties in this embodiment. Here, the thickness of the ceramic substrate 11 is set to be in a range of 0.2 mm to 1.5 mm, and is set to 0.635 mm in this embodiment.

Figure 4:
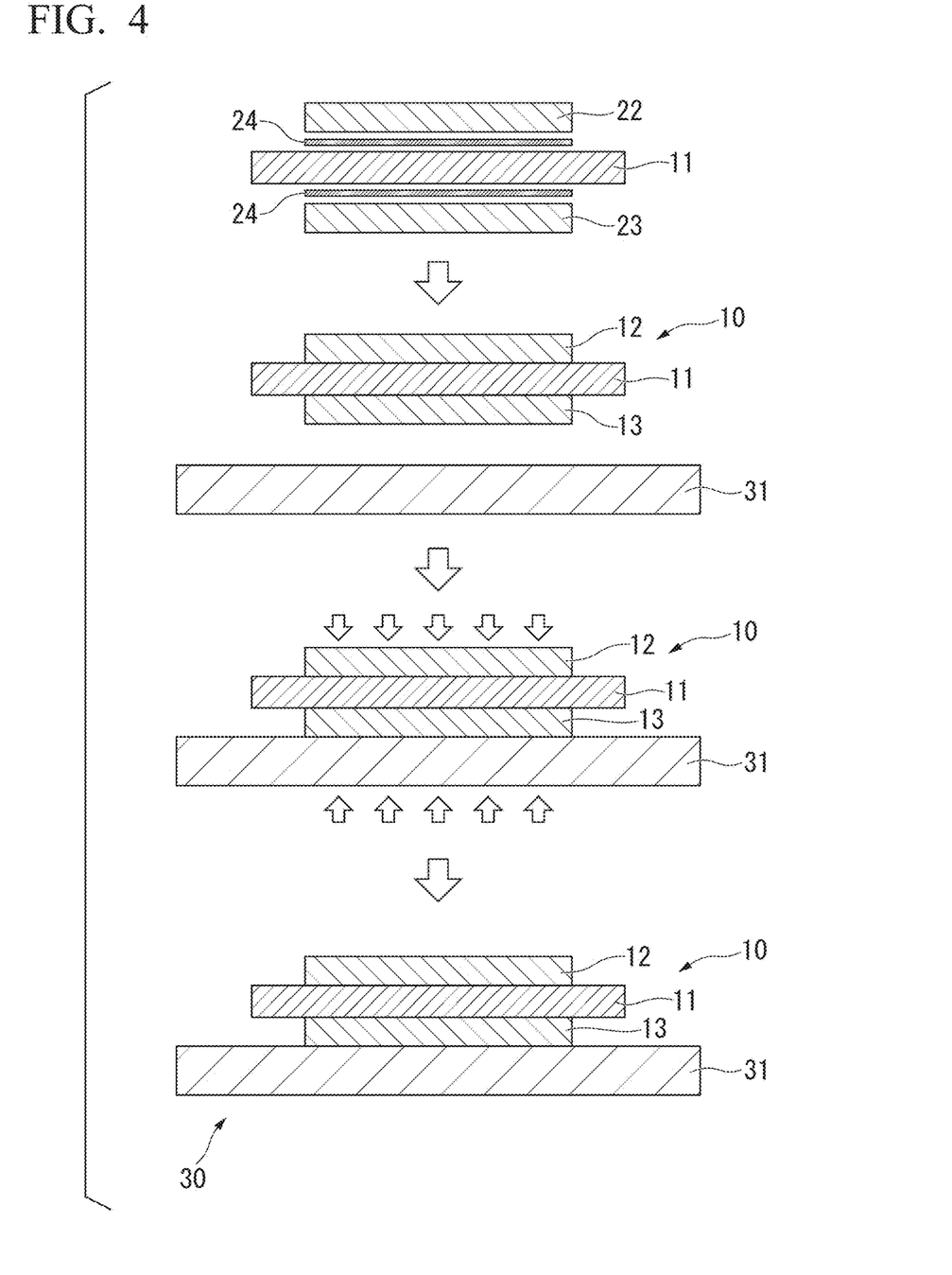
FIG. 4 is a view showing the method for manufacturing the power module substrate with heat sink according to the embodiment of the invention.

As shown in FIG. 4, the circuit layer 12 is formed by bonding an aluminum plate 22 formed from aluminum or an aluminum alloy on the one surface of the ceramic substrate 11. In this embodiment, as the aluminum plate 22 that constitutes the circuit layer 12, a 2N-aluminum rolled plate with purity of 99 mass % or greater is used. A circuit pattern is formed in the circuit layer 12, and one surface (upper surface in FIG. 1) is set as a mounting surface on which the semiconductor element 3 is mounted. Here, the thickness of the circuit layer 12 (aluminum plate 22) is set to be in a range of 0.1 mm to 1.0 mm, and is set to 0.6 mm in this embodiment.

As shown in FIG. 4, the metal layer 13 is formed by bonding an aluminum plate 23 formed from aluminum or an aluminum alloy on the other surface of the ceramic substrate 11. In this embodiment, as the aluminum plate 23 that constitutes the metal layer 13, a 4N-aluminum rolled plate with purity of 99.99 mass % or greater is used. Here, the thickness of the metal layer 13 (aluminum plate 23) is set to be in a range of 0.1 mm to 6.0 mm, and is set to 2.0 mm in this embodiment.

The heat sink 31 is configured to dissipate heat on the power module substrate 10 side. In this embodiment, as shown in FIG. 1, the heat sink 31 is provided with a flow passage 32 through which a cooling medium circulates.

The heat sink 31 is constituted by a material in which a difference in a concentration of a contained element other than Al between the aluminum (in this embodiment 4N-aluminum with purity of 99.99 mass % or greater) that constitutes the metal layer 13, and an aluminum alloy that constitutes the heat sink 31 becomes 1 at % or greater.

More preferably, the contained element other than Al may be set to one kind or two or more kinds of elements selected from Si, Cu, Mn, Fe, Mg, Zn, Ti, and Cr.

Still more preferably, as the contained element other than Al, one kind or two or more kinds of elements selected from Si, Cu, Mn, Fe, Mg, Zn, Ti, and Cr may be contained in a total amount of 1 at % or greater. The amount of Si contained may be set to 15 at % or less, the amount of Cu contained may be set to 10 at % or less, the amount of Mn contained may be set to 2 at % or less, the amount of Fe contained may be set to 1 at % or less, the amount of Mg contained may be set to 5 at % or less, the amount of Zn contained may be set to 10 at % or less, the amount of Ti contained may be set to 1 at % or less, and the amount of Cr contained may be set to 1 at % or less.

In this embodiment, the heat sink 31 is constituted by ADC12 that is an aluminum alloy for die-casting which is defined in JIS H 2118:2006. Furthermore, the ADC12 is an aluminum alloy that contains Cu in a range of 1.5 mass % to 3.5 mass %, and Si in a range of 9.6 mass % to 12.0 mass %.

In addition, in the power module substrate with heat sink 30 according to this embodiment, the metal layer 13 and the heat sink 31 are bonded to each other through solid-phase diffusion bonding. That is, in this embodiment, the metal layer 13 is constituted by a 4N-aluminum with purity of 99.99 mass % or greater, and the heat sink 31 is constituted by the ADC12 that is an aluminum alloy for die-casting. Accordingly, the metal layer 13 and the heat sink 31 are different in the purity of aluminum. In addition, the metal layer 13 is constituted by a high-purity aluminum material, and the heat sink 31 is constituted by a low-purity aluminum material.

Here, mapping observation results of a bonding interface between the metal layer 13 and the heat sink 31 with a SEM and an EPMA by using JXA-8530F manufactured by JEOL Ltd. are shown in FIGS. 2(a) to 2(c). From FIGS. 2(a) to 2(c), it is confirmed that an added element (Cu, Si) included in the heat sink 31 is diffused to the metal layer 13 side. Furthermore, with regard to a diffusion depth from the bonding interface to the metal layer 13 side, the diffusion depth of Cu is set to 10 μm or greater, and the diffusion depth of Si is set to 45 μm or greater. Furthermore, the diffusion depth of Cu may be set to 25 μm or greater, and the diffusion depth of Si may be set to 45 μm or greater.

Next, description will be given of a method for manufacturing the power module substrate with heat sink 30 according to this embodiment with reference to FIG. 3 and FIG. 4.

(Aluminum Plate Bonding Step S01)

First, as shown in FIG. 4, the aluminum plate 22 that constitutes the circuit layer 12, the aluminum plate 23 that constitutes the metal layer 13, and the ceramic substrate 11 are bonded to each other. In this embodiment, the aluminum plate 22 formed from a rolled plate of 2N-aluminum, the aluminum plate 23 formed from a rolled plate of 4N-aluminum, and the ceramic substrate 11 formed from AlN are bonded to each other with an Al—Si-based brazing material 24.

In the aluminum plate bonding step S01, first, the aluminum plate 22 and the aluminum plate 23 are respectively laminated on the one surface and on the other surface of the ceramic substrate 11 with the Al—Si-based brazing material 24 interposed therebetween (aluminum plate laminating step S11).

Next, in a state in which a load of 0.1 MPa to 3.5 MPa is applied to the ceramic substrate 11, the aluminum plate 22, and the aluminum plate 23, which are laminated, in a lamination direction, the laminated body is put into a heating furnace that is set to vacuum or an argon atmosphere, and is retained for 0.5 hours to 3 hours at 600° C. to 650° C., thereby forming a molten metal region between the ceramic substrate 11, the aluminum plate 22, and the aluminum plate 23 (heating step S12).

Then, the laminated body is cooled down to solidify the molten metal region (solidification step S13). In this manner, the aluminum plate 22, the ceramic substrate 11, and the aluminum plate 23 are bonded to each other, thereby forming the circuit layer 12 and the metal layer 13. According to this, the power module substrate 10 according to this embodiment is manufactured.

(Heat Sink Bonding Step S02)

Next, the heat sink 31 is bonded to the other surface (surface opposite to the bonding surface with the ceramic substrate 11) of the metal layer 13 in the power module substrate 10.

In the heat sink bonding step S02, first, as shown in FIG. 4, the heat sink 31 is laminated on the other surface of the power module substrate 10 (heat sink laminating step S21).

In a state in which a load of 0.3 MPa to 3.0 MPa is applied to a laminated body of the power module substrate 10 and the heat sink 31 in a lamination direction, the laminated body is put into a vacuum heating furnace.

In addition, the laminated body is retained at a temperature that is equal to or higher than 90% of a solidus temperature (K) of the low-purity aluminum material and lower than the solidus temperature of the low-purity aluminum material for 1 hour or longer to perform solid-phase diffusion bonding (solid-phase diffusion bonding step S22). 90% of the solidus temperature (K) of the low-purity aluminum material represents a temperature corresponding to 90% when the solidus temperature of the low-purity aluminum material is expressed as the absolute temperature. In this embodiment, ADC12 is set as the low-purity aluminum material, and the solidus temperature thereof is 788K (515° C.). Accordingly, a heating temperature is set to be equal to or higher than 90% of the solidus temperature, that is, 709.2K (436.2° C.), and lower than the solidus temperature, that is, 788K (515° C.).

In this embodiment, bonding surfaces of the metal layer 13 and the heat sink 31 are subjected to solid-phase diffusion bonding after being flat by removing scratches on the surfaces. Furthermore, surface roughness of each of the bonding surfaces of the metal layer 13 and the heat sink 31 is set to be in a range of 0.5 µm or less in terms of arithmetic average roughness Ra (JIS B 0601(1994)).

In this manner, the power module substrate with heat sink 30 according to this embodiment is manufactured.

(Die-Bonding Step S03)

Next, the semiconductor element 3 is bonded to one surface of the circuit layer 12 in the power module substrate 10 through soldering.

Through the above-described steps, the power module 1 shown in FIG. 1 is produced.

According to the method for manufacturing the power module substrate with heat sink 30 according to this embodiment configured as described above, the aluminum material that constitutes the metal layer 13 is set to 4N-aluminum with purity of 99.99 mass % or greater, and the aluminum material that constitutes the heat sink 31 is set to ADC12 (Cu: 1.5 mass % to 3.5 mass %, and Si: 9.6 mass % to 12.0 mass %). Accordingly, Cu and Si in the heat sink 31 are diffused to the metal layer 13 side during solid-phase diffusion bonding, and thus self-diffusion of aluminum is promoted. According to this, it is possible to reliably realize the solid-phase diffusion bonding between the metal layer and the heat sink in relatively short time.

Figure 2:
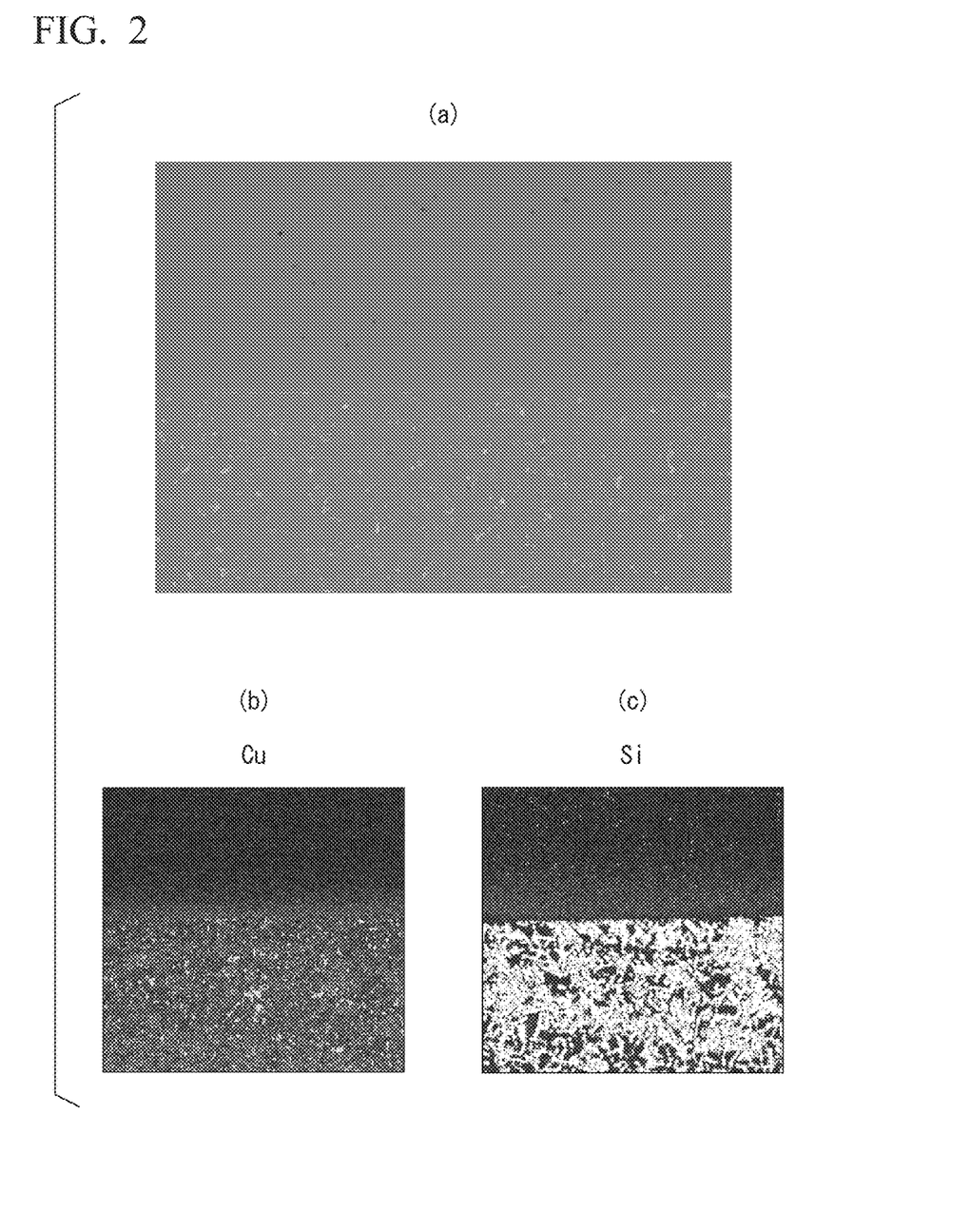
FIG. 2 is a view showing an observation result and an analysis result of a bonding interface between a metal layer and a heat sink of the power module substrate with heat sink.

In addition, in this embodiment, the metal layer 13 and the heat sink 31, which are constituted by an aluminum material, are subjected to the solid-phase diffusion bonding. Accordingly, as shown in FIG. 2, an abnormal phase is not formed in a bonding interface between the heat sink 31 and the metal layer 13.

Accordingly, even when a heat cycle is loaded, there is no concern that cracking and the like occur in the bonding interface, and thus it is possible to manufacture the power module substrate with heat sink 30 excellent in bonding reliability against the heat cycle.

In addition, in this embodiment, the aluminum material that constitutes the heat sink 31 is set to ADC12 (Cu: 1.5 mass % to 3.5 mass %, and Si: 9.6 mass % to 12.0 mass %), and Cu and Si are excellent in an operational effect of promoting self-diffusion of aluminum. Accordingly, it is possible to reliably realize the solid-phase diffusion bonding between the metal layer 13 and the heat sink 31, which are constituted by an aluminum material, in short time.

In addition, in the aluminum material that constitutes the heat sink 31, the amount of Si contained is set to 12.0 mass % or less (11.6 at % or less (converted value)), and the amount of Cu contained is set to 3.5 mass % or less (1.5 at % or less (converted value)). Accordingly, it is possible to suppress the bonding interface from being hard more than necessary due to the atoms. As a result, it is possible to reliably manufacture the power module substrate with heat sink which is excellent in bonding reliability against a heat cycle.

In addition, in a state in which the metal layer 13 and the heat sink 31 are laminated, and a load of 0.3 MPa to 3.0 MPa is applied to the resultant laminated body in a lamination direction, the laminated body is retained at a temperature that is equal to or higher than 90% of the solidus temperature (K) of the low-purity aluminum material and is lower than the solidus temperature of the low-purity aluminum material for 1 hour or longer to subject the metal layer 13 and the heat sink 31 to the solid-phase diffusion bonding. Accordingly, it is possible to promote diffusion migration of aluminum, and thus it is possible to reliably bond together the metal layer 13 and the heat sink 31.

In a case where the load is 0.3 MPa or greater, a contact area at initial bonding is sufficiently secured, and thus it is possible to bond the metal layer 13 and the heat sink 31 in a satisfactory manner. In addition, in a case where the load is 3.0 MPa or less, it is possible to suppress deformation from occurring in the metal layer 13 or the heat sink 31.

In a case where the retention temperature is equal to or higher than 90% of the solidus temperature (K) of the low-purity aluminum material, it is possible to secure a sufficient diffusion velocity, and thus it is possible to bond the metal layer 13 and the heat sink 31 in a satisfactory manner. In a case where the retention temperature is lower than the solidus temperature of the low-purity aluminum material, a liquid phase does not occur, or it is possible to suppress deformation from occurring in the metal layer 13 or the heat sink 31. Accordingly, it is possible to reliably realize the solid-phase diffusion bonding between the metal layer 13 and the heat sink 31.

In a case where the retention time is 1 hour or longer, solid-phase diffusion sufficiently progresses, and thus it is possible to bond the metal layer 13 and the heat sink 31 in a satisfactory manner.

In addition, in this embodiment, scratches on the bonding surfaces of the metal layer 13 and the heat sink 31 before bonding are removed, and the surface roughness thereof is set to be in a range of 0.5 μm or less in terms of arithmetic average roughness Ra (JIS B 0601(1994)). Accordingly, the metal layer 13 and the heat sink 31 are reliably brought into contact with each other, and thus it is possible to promote diffusion migration of an aluminum atom and an added element (Cu, Si) of the heat sink 31. As a result, it is possible to reliably bond the metal layer 13 and the heat sink 31.

Hereinbefore, description has been given of the embodiment of the invention, but the invention is not limited thereto, and modifications can be appropriately made in a range not departing from the technical spirit of the invention.

For example, the materials of the metal layer and the heat sink are not limited to this embodiment. Any one of the aluminum material that constituted the bonding surface of the metal layer, and the aluminum material that constitutes the bonding surface of the heat sink may be set to a high-purity aluminum material with high aluminum purity, the other aluminum material may be set to a low-purity aluminum material with low aluminum purity, and a difference in a concentration of a contained element other than Al between the high-purity aluminum material and the low-purity aluminum material may be set to 1 at % or greater.

Specifically, in this embodiment, description has been given of a configuration in which the metal layer is constituted by 4N-aluminum with purity of 99.99 mass %, but the metal layer may be constituted by another pure aluminum or aluminum alloy without limitation thereto. For example, 2N-aluminum such as A1050 and A1085 with purity of 99 mass % or greater may be used. In this case, grain boundary growth at a bonding temperature is suppressed when considering that an initial impurity concentration of the metal layer is high, and thus it is possible to expect grain boundary diffusion. As a result, it is possible to promote diffusion migration of a contained element from the heat sink side.

In addition, in this embodiment, description has been given of a configuration in which the heat sink is constituted by ADC12, but the heat sink may be constituted by another pure aluminum or aluminum alloy such as A3003 and A6063 without limitation thereto.

In addition, the heat sink side may be constituted by a high-purity aluminum material, and the metal layer side may be constituted by a low-purity aluminum material.

Figure 5:
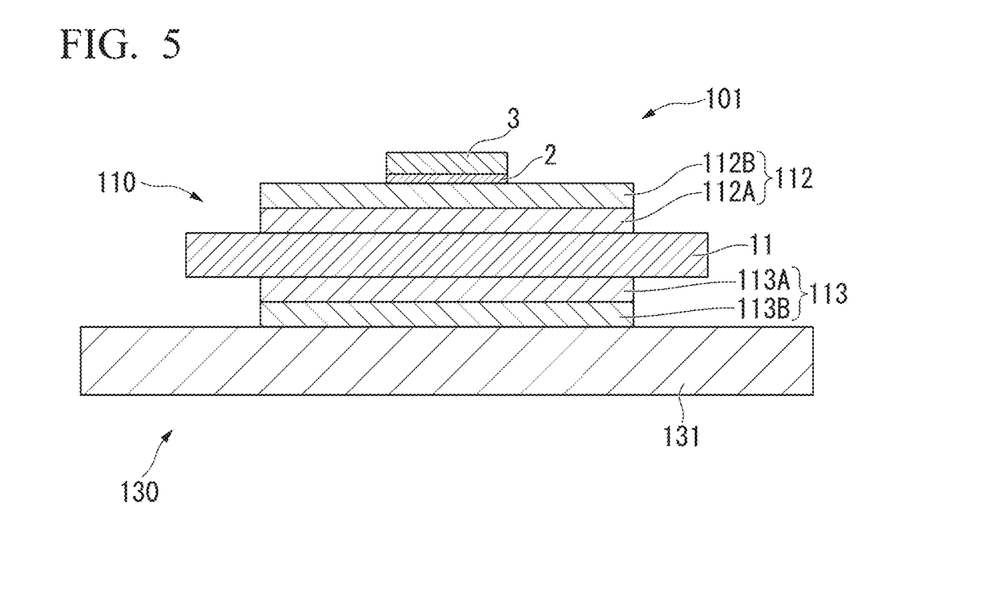
FIG. 5 is a schematic view showing a power module substrate with heat sink and a power module according to another embodiment of the invention.

In addition, in this embodiment, description has been given of a configuration in which the entirety of the metal layer is constituted by aluminum or an aluminum alloy, but there is no limitation thereto. For example, as shown in FIG. 5, the bonding surface with the heat sink in the metal layer may be constituted by aluminum or an aluminum alloy. In a power module substrate with heat sink 130 and a power module 101 as shown in FIG. 5, a metal layer 113 has a structure in which a copper layer 113A and an aluminum layer 113B are laminated, the ceramic substrate 11 and the copper layer 113A are bonded to each other, and the aluminum layer 113B and a heat sink 131 are subjected to the solid-phase diffusion bonding. Furthermore, in FIG. 5, a circuit layer 112 also has a structure in which a copper layer 112A and an aluminum layer 112B are laminated, and the semiconductor element 3 is bonded to the aluminum layer 112B with the solder layer 2 interposed therebetween.

Figure 6:
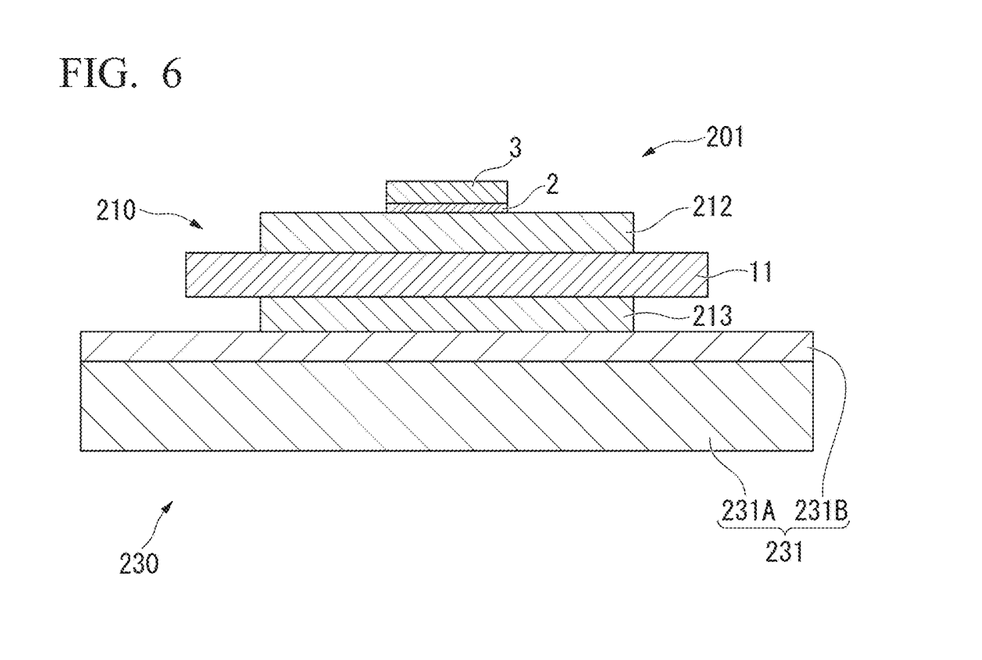
FIG. 6 is a schematic view showing a power module substrate with heat sink and a power module according to still another embodiment of the invention.

Similarly, in this embodiment, description has been given of a configuration in which the entirety of the heat sink is constituted by aluminum or an aluminum alloy, but there is no limitation thereto. For example, as shown in FIG. 6, the bonding surface with the metal layer in the heat sink may be constituted by aluminum or an aluminum alloy. In a power module substrate with heat sink 230 and a power module 201 as shown in FIG. 6, a heat sink 231 has a structure in which an aluminum layer 231B constituted by aluminum or an aluminum alloy, and a heat sink main body 231A constituted by copper or a copper alloy are laminated, and a metal layer 213 and the aluminum layer 231B (heat sink 231) are subjected to the solid-phase diffusion bonding.

In addition, in this embodiment, description has been given of a configuration in which the aluminum plate that constitutes the circuit layer is constituted by 2N-aluminum with purity of 99 mass % or greater. However, the aluminum plate may be constituted by pure aluminum with purity of 99.99 mass % or greater, or another pure aluminum or aluminum alloy without limitation to the above-described configuration.

In addition, in the invention, the structure of the circuit layer is not limited, and change of design can be appropriately made. For example, the circuit layer may be constituted by copper or a copper alloy. In addition, as is the case with the power module substrate with heat sink 130 and the power module 101 as shown in FIG. 5, the circuit layer 112 may have a laminated structure of the copper layer 112A and the aluminum layer 112B.

In addition, in this embodiment, description has been given of a configuration in which the aluminum plate that is set as the circuit layer and the metal layer, and the ceramic substrate are bonded to each other by using an Al—Si-based brazing material, but there is not limitation thereto. The aluminum plate and the ceramic substrate may be bonded to each other by using a transient liquid phase bonding method, a casting method, a metal paste method, and the like.

In addition, in this embodiment, description has been given of a configuration in which the insulating layer is constituted by a ceramic substrate formed from AlN, but another ceramic substrate such as $Si_3N_4$ and $Al_2O_3$ may be used without limitation thereto.

In addition, the thickness of the insulating layer, the circuit layer, the metal layer, and the heat sink is not limited to this embodiment, and appropriate change of design can be made.

EXAMPLES

Description will be given of a confirmation experiment performed to confirm effectiveness of the invention.

Figure 3:
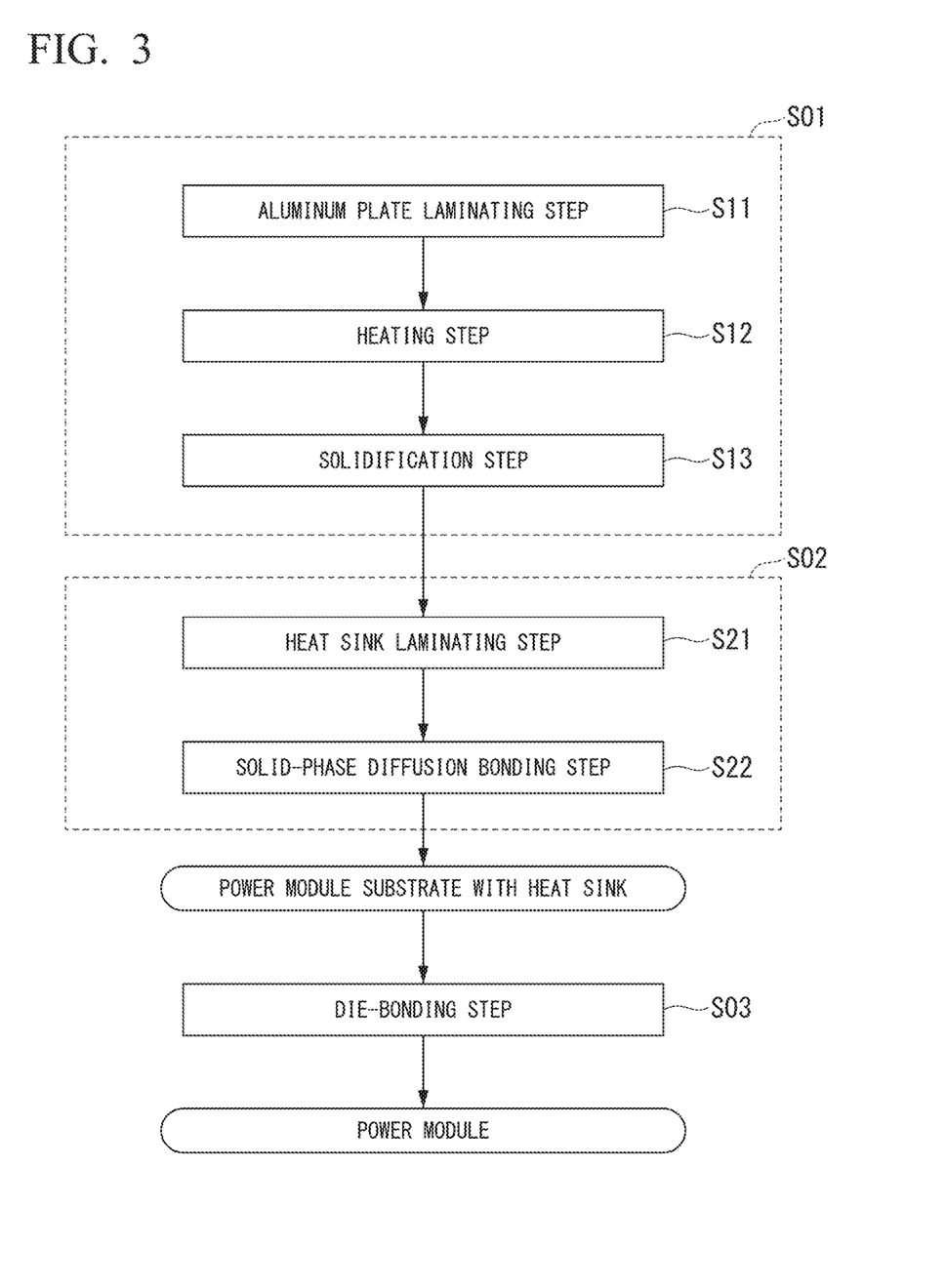
FIG. 3 is a flowchart showing a method for manufacturing the power module substrate with heat sink and the power module according to an embodiment of the invention.

Power module substrates with heat sink of the examples and comparative examples were manufactured in accordance with a procedure described in a flowchart of FIG. 3.

Furthermore, as the ceramic substrate, a substrate, which is constituted by AlN and has dimensions of 40 mm×40 mm and a thickness of 0.635 mm, was used.

The circuit layer was formed by bonding a rolled plate (37 mm×37 mm, thickness: 0.6 mm) of 2N-aluminum with purity of 99 mass % or greater to the ceramic substrate by using a brazing material of Al-7.5 mass % of Si.

The metal layer was formed by bonding a rolled plate (37 mm×37 mm, thickness: 0.6 mm) formed from an aluminum material shown in Table 1 to the ceramic substrate by using a brazing material of Al-7.5 mass % of Si.

As the heat sink, a heat sink, which is constituted by a material described in Table 2 and has dimensions of 50 mm×50 mm and a thickness of 5 mm, was used.

The solid-phase diffusion bonding between the metal layer and the heat sink was performed under conditions shown in Table 3.

In addition, the following power module substrates with heat sink were prepared as Conventional Example 1 to Conventional Example 3.

In a state in which a rolled plate (37 mm×37 mm, thickness: 0.6 mm) of 2N-aluminum as the circuit layer, a ceramic substrate (40 mm×40 mm, thickness: 0.635 mm) that is constituted by AlN, a rolled plate (37 mm×37 mm, thickness: 0.6 mm) of 4N-aluminum as the metal layer were laminated through a brazing material of Al-7.5 mass % of Si, and the resultant laminated body was compressed by 5 kgf/cm$^2$ in a lamination direction, the laminated body was put into a vacuum heating furnace and was heated at 650° C. for 30 minutes for bonding, thereby preparing a power module substrate.

In addition, in Conventional Example 1, the power module substrate and a heat sink (A6063 rolled plate having dimensions of 50 mm×50 mm and a thickness of 5 mm) plated with Ni were bonded to each other with Sn—Ag—Cu solder interposed therebetween.

In Conventional Example 2, the power module substrate and a heat sink (A6063 rolled plate having dimensions of 50 mm×50 mm and a thickness of 5 mm) were bonded to each other with a brazing material of Al-10 mass % of Si interposed therebetween.

In Conventional Example 3, the power module substrate and a heat sink (A6063 rolled plate having dimensions of 50 mm×50 mm and a thickness of 5 mm) were subjected to solid-phase diffusion bonding with Cu foil (thickness: 200 μm) interposed therebetween.

(Diffusion Distance of Contained Element)

A cross-sectional surface in the vicinity of the bonding interface between the heat sink and the metal layer in the examples obtained was observed to measure a diffusion distance of a contained element other than Al from the low-purity aluminum material side to the high-purity aluminum material side. An evaluation result is shown in Table 4.

With regard to the diffusion distance of the contained element, line analysis was performed from the bonding interface between the low-purity aluminum material and the high-purity aluminum material toward the high-purity aluminum material side by using EPMA (JXA-8530F manufactured by JEOL Ltd.) to measure a distance and a concentration of the contained element. A distance, at which the concentration of the contained element is the half of the concentration of the contained element contained in the low-purity aluminum material, was set as the diffusion distance.

(Heat Cycle Test)

A heat cycle test was performed as follows. A heat cycle at −40° C. for five minutes and at 150° C. for five minutes was performed 4000 times at a liquid phase (Fluorinert) with respect to a test specimen (a power module with heat sink) by using a hot-cold shock testing device TSB-51 manufactured by ESPEC CORP.

In addition, a bonding rate before and after the heat cycle test was evaluated as follows. In addition, presence or absence of ceramic cracking after the heat cycle test was evaluated with naked eyes. Evaluation results are shown in Table 4.

(Bonding Rate)

The bonding rate between the metal layer and the heat sink was obtained with the following expression by using an ultrasonic flaw detection device (FineSAT200 manufactured by Hitachi Power Solutions Co., Ltd.). Here, an initial bonding area was set as an area (37 mm square) to be bonded before bonding. In an image obtained by subjecting an ultrasonic flaw detection image to binarization processing, peeling-off is shown as a white portion in a bonding portion, and thus an area of the white portion was set as a peeled-off area.

(Bonding rate (%))={(initial bonding area)−(peeled-off area)}/(initial bonding area)×100

TABLE 1

| | | Metal layer | | | | | | | | | |
|---|---|---|---|---|---|---|---|---|---|---|---|
| | Material | Component composition (at %) | | | | | | | | | Surface roughness |
| | name | Si | Cu | Mn | Fe | Mg | Zn | Ti | Cr | Al | Ra (μm) |
| Example 1 | 4NAl | 0.0010 | 0.0118 | 0.0002 | 0.0041 | 0.0001 | — | — | — | Remainder | 0.24 |
| Example 2 | 4NAl | 0.0010 | 0.0118 | 0.0002 | 0.0041 | 0.0001 | — | — | — | Remainder | 0.24 |
| Example 3 | 4NAl | 0.0010 | 0.0118 | 0.0002 | 0.0041 | 0.0001 | — | — | — | Remainder | 0.24 |
| Example 4 | 3NAl | 0.0052 | 0.0094 | 0.0002 | 0.0083 | 0.0003 | — | — | — | Remainder | 0.21 |
| Example 5 | A1085 | 0.0229 | 0.0024 | 0.0020 | 0.1882 | 0.0036 | — | — | — | Remainder | 0.32 |
| Example 6 | A1050 | 0.0332 | 0.0634 | 0.0041 | 0.6598 | 0.0009 | — | — | — | Remainder | 0.15 |
| Example 7 | A1050 | 0.0415 | 0.0258 | 0.0081 | 0.5570 | 0.0027 | 0.0193 | 0.0177 | — | Remainder | 0.20 |
| Example 8 | A1100 | 0.0857 | 0.3271 | 0.0202 | 1.1703 | 0.0071 | — | — | — | Remainder | 0.24 |
| Example 9 | 4NAl | 0.0010 | 0.0118 | 0.0002 | 0.0041 | 0.0001 | — | — | — | Remainder | 0.24 |
| Example 10 | 4NAl | 0.0010 | 0.0118 | 0.0002 | 0.0041 | 0.0001 | — | — | — | Remainder | 0.24 |
| Example 11 | 4NAl | 0.0010 | 0.0118 | 0.0002 | 0.0041 | 0.0001 | — | — | — | Remainder | 0.24 |
| Comparative Example 1 | 4NAl | 0.0010 | 0.0118 | 0.0002 | 0.0041 | 0.0001 | — | — | — | Remainder | 0.24 |
| Comparative Example 2 | A1050 | 0.0332 | 0.0634 | 0.0041 | 0.6598 | 0.0009 | — | — | — | Remainder | 0.15 |
| Comparative Example 3 | ADC12 | 11.7243 | 4.2854 | 0.3332 | 1.2554 | 0.1214 | — | — | — | Remainder | 0.26 |
| Conventional Example 1 | 4NAl | 0.0010 | 0.0118 | 0.0002 | 0.0041 | 0.0001 | — | — | — | Remainder | 0.24 |
| Conventional Example 2 | 4NAl | 0.0010 | 0.0118 | 0.0002 | 0.0041 | 0.0001 | — | — | — | Remainder | 0.24 |
| Conventional Example 3 | 4NAl | 0.0010 | 0.0118 | 0.0002 | 0.0041 | 0.0001 | — | — | — | Remainder | 0.24 |

TABLE 2

| | Heat sink | | | | | | | | | | Surface roughness |
|---|---|---|---|---|---|---|---|---|---|---|---|
| | Material | Component composition (at %) | | | | | | | | | |
| | name | Si | Cu | Mn | Fe | Mg | Zn | Ti | Cr | Al | Ra (μm) |
| Example 1 | ADC12 | 11.7243 | 4.2854 | 0.3332 | 1.2554 | 0.1214 | — | — | — | Remainder | 0.24 |
| Example 2 | ADC12 | 11.7243 | 4.2854 | 0.3332 | 1.2554 | 0.1214 | — | — | — | Remainder | 0.24 |
| Example 3 | ADC12 | 11.7243 | 4.2854 | 0.3332 | 1.2554 | 0.1214 | — | — | — | Remainder | 0.24 |
| Example 4 | ADC12 | 11.7243 | 4.2854 | 0.3332 | 1.2554 | 0.1214 | — | — | — | Remainder | 0.21 |
| Example 5 | ADC12 | 11.7243 | 4.2854 | 0.3332 | 1.2554 | 0.1214 | — | — | — | Remainder | 0.32 |
| Example 6 | ADC12 | 11.7243 | 4.2854 | 0.3332 | 1.2554 | 0.1214 | — | — | — | Remainder | 0.15 |
| Example 7 | ADC12 | 11.7243 | 4.2854 | 0.3332 | 1.2554 | 0.1214 | — | — | — | Remainder | 0.20 |
| Example 8 | ADC12 | 11.7243 | 4.2854 | 0.3332 | 1.2554 | 0.1214 | — | — | — | Remainder | 0.24 |
| Example 9 | A6063 | 0.3843 | 0.0071 | 0.0589 | 0.3511 | 0.4225 | 0.0484 | 0.0106 | 0.0038 | Remainder | 0.24 |
| Example 10 | ADC14 | 16.5595 | 9.2687 | 0.2842 | 1.7138 | 0.4274 | — | — | — | Remainder | 0.24 |
| Example 11 | Si5.5% | 5.7018 | 0.0000 | 0.0002 | 0.0004 | 0.0001 | — | — | — | Remainder | 0.30 |
| Comparative Example 1 | 4NAI | 0.0010 | 0.0118 | 0.0002 | 0.0041 | 0.0001 | — | — | — | Remainder | 0.24 |
| Comparative Example 2 | A1050 | 0.0332 | 0.0634 | 0.0041 | 0.6598 | 0.0009 | — | — | — | Remainder | 0.15 |
| Comparative Example 3 | ADC12 | 11.7243 | 4.2854 | 0.3332 | 1.2554 | 0.1214 | — | — | — | Remainder | 0.26 |
| Conventional Example 1 | ADC12 | 11.7243 | 4.2854 | 0.3332 | 1.2554 | 0.1214 | — | — | — | Remainder | 0.24 |
| Conventional Example 2 | ADC12 | 11.7243 | 4.2854 | 0.3332 | 1.2554 | 0.1214 | — | — | — | Remainder | 0.24 |
| Conventional Example 3 | A6063 | 0.3843 | 0.0071 | 0.0589 | 0.3511 | 0.4225 | 0.0484 | 0.0106 | 0.0038 | Remainder | 0.24 |

TABLE 3

| | Metal layer | | Heat sink | | Difference in concentration of impurities ((a)-(b), absolute value) | Bonding method | Bonding conditions | | | |
|---|---|---|---|---|---|---|---|---|---|---|
| | Material name | Total amount of elements other than Al (at %) (a) | Material name | Total amount of elements other than Al (at %) (b) | | | Atmosphere | Load (MPa) | Retention temperature (° C.) | Retention time (min) |
| Example 1 | 4NAI | 0.0172 | ADC12 | 17.7197 | 17.7024 | Solid-phase diffusion | Vacuum ($10^{-4}$ Pa) | 0.3 | 500 | 720 |
| Example 2 | 4NAI | 0.0172 | ADC12 | 17.7197 | 17.7024 | Solid-phase diffusion | Vacuum ($10^{-4}$ Pa) | 3 | 500 | 90 |
| Example 3 | 4NAI | 0.0172 | ADC12 | 17.7197 | 17.7024 | Solid-phase diffusion | Vacuum ($10^{-4}$ Pa) | 3 | 500 | 60 |
| Example 4 | 3NAI | 0.0234 | ADC12 | 17.7197 | 17.6963 | Solid-phase diffusion | Vacuum ($10^{-4}$ Pa) | 3 | 500 | 90 |
| Example 5 | A1085 | 0.2190 | ADC12 | 17.7197 | 17.5006 | Solid-phase diffusion | Vacuum ($10^{-4}$ Pa) | 3 | 500 | 90 |
| Example 6 | A1050 | 0.7613 | ADC12 | 17.7197 | 16.9583 | Solid-phase diffusion | Vacuum ($10^{-4}$ Pa) | 3 | 500 | 90 |
| Example 7 | A1050 | 0.6722 | ADC12 | 17.7197 | 17.0475 | Solid-phase diffusion | Vacuum ($10^{-4}$ Pa) | 3 | 500 | 90 |
| Example 8 | A1100 | 1.6104 | ADC12 | 17.7197 | 16.1092 | Solid-phase diffusion | Vacuum ($10^{-4}$ Pa) | 3 | 500 | 90 |
| Example 9 | 4NAI | 0.0172 | A6063 | 1.2867 | 1.2695 | Solid-phase diffusion | Vacuum ($10^{-4}$ Pa) | 3 | 500 | 720 |
| Example 10 | 4NA1 | 0.0172 | ADC14 | 28.2536 | 28.2363 | Solid-phase diffusion | Vacuum ($10^{-4}$ Pa) | 3 | 500 | 90 |
| Example 11 | 4NAI | 0.0172 | Si5.5% | 5.7025 | 5.6853 | Solid-phase diffusion | Vacuum ($10^{-4}$ Pa) | 3 | 550 | 90 |
| Comparative Example 1 | 4NAI | 0.0172 | 4NAI | 0.0172 | 0.0000 | Solid-phase diffusion | Vacuum ($10^{-4}$ Pa) | 3 | 640 | 90 |
| Comparative Example 2 | A1050 | 0.7613 | A1050 | 0.7613 | 0.0000 | Solid-phase diffusion | Vacuum ($10^{-4}$ Pa) | 3 | 640 | 90 |
| Comparative Example 3 | ADC12 | 17.7197 | ADC12 | 17.7197 | 0.0000 | Solid-phase diffusion | Vacuum ($10^{-4}$ Pa) | 3 | 500 | 90 |
| Conventional Example 1 | 4NAI | 0.0172 | ADC12 | 17.7197 | 17.7024 | Soldering | $N_2 + H_2$ | — | — | — |
| Conventional Example 2 | 4NAI | 0.0172 | ADC12 | 17.7197 | 17.7024 | Brazing | Vacuum ($10^{-4}$ Pa) | 0.3 | — | — |
| Conventional Example 3 | 4NA1 | 0.0172 | A6063 | 1.2867 | 1.2695 | Cu | Vacuum ($10^{-4}$ Pa) | 10 | 540 | 90 |

TABLE 4

|  | Diffusion distance of contained element (μm) | Bonding rate Initial (%) | Bonding rate After heat cycle test (%) | Cracking in ceramic substrate |
|---|---|---|---|---|
| Example 1 | Cu: 49, Si: 102 | 99 | 96 | Absent |
| Example 2 | Cu: 18, Si: 41 | 98 | 94 | Absent |
| Example 3 | Cu: 14, Si: 33 | 100 | 98 | Absent |
| Example 4 | Cu: 19, Si: 41 | 100 | 98 | Absent |
| Example 5 | Cu: 34, Si: 53 | 100 | 96 | Absent |
| Example 6 | Cu: 27, Si: 50 | 100 | 98 | Absent |
| Example 7 | Cu: 27, Si: 47 | 100 | 96 | Absent |
| Example 8 | Cu: 30, Si: 48 | 100 | 98 | Absent |
| Example 9 | Cu: —, Si: 22 | 98 | 97 | Absent |
| Example 10 | Cu: 35, Si: 75 | 100 | 99 | Absent |
| Example 11 | Cu: 18, Si: — | 98 | 97 | Absent |
| Comparative Example 1 | — | — | — | Absent |
| Comparative Example 2 | — | — | — | Absent |
| Comparative Example 3 | — | — | — | Absent |
| Conventional Example 1 | — | 94 | 86 | Absent |
| Conventional Example 2 | — | 98 | 80 | Present |
| Conventional Example 3 | — | 100 | 81 | Absent |

In Conventional Example 1, the bonding rate after the heat cycle test greatly decreased. The reason for this is assumed to be because cracks occurred in the solder layer due to the heat cycle.

In Conventional Example 2, the bonding rate after the heat cycle test decreased, and cracking was confirmed in the ceramic substrate.

In addition, in Comparative Examples 1 to 3 in which the metal layer and the heat sink were respectively constituted by aluminum materials with the same purity, the metal layer and the heat sink were not bonded under the above-described solid-phase diffusion conditions.

In contrast, in the examples, the bonding rate did not greatly increase after the heat cycle test, the ceramic cracking was also not confirmed, and bonding reliability was excellent.

As described above, according to the invention, it is possible to manufacture the power module substrate with heat sink which is capable of suppressing occurrence of cracks and the like in a bonding interface even in heat cycle load.

INDUSTRIAL APPLICABILITY

According to the method for manufacturing the power module substrate with heat sink of the invention, it is possible to reliably subject the metal layer and the heat sink to the solid-phase diffusion bonding in relatively short time. In addition, since the heat sink and the metal layer are subjected to the solid-phase diffusion bonding, even in heat cycle load, there is no concern that cracking and the like occur in a bonding interface. As a result, it is possible to obtain a power module substrate with heat sink which is excellent in bonding reliability against the heat cycle.

REFERENCE SIGNS LIST

1, 101, 201: Power module
10, 110, 210: Power module substrate
11: Ceramic substrate
12, 112, 212: Circuit layer
13, 113, 213: Metal layer
30, 130, 230: Power module substrate with heat sink
31, 131, 231: Heat sink

The invention claimed is:

1. A method for manufacturing a power module substrate with heat sink which includes an insulating layer, a circuit layer that is formed on one surface of the insulating layer, a metal layer that is formed on the other surface of the insulating layer, a heat sink that is disposed on a surface of the metal layer on a side opposite to the insulating layer, wherein a bonding surface with the heat sink in the metal layer and a bonding surface with the metal layer in the heat sink are constituted by an aluminum material including aluminum or an aluminum alloy, in the aluminum material that constitutes the bonding surface of the metal layer, and the aluminum material that constitutes the bonding surface of the heat sink, any one aluminum material is set to a high-purity aluminum material with high aluminum purity, and the other aluminum material is set to a low-purity aluminum material with low aluminum purity, a difference in a concentration of a contained element other than Al between the high-purity aluminum material and the low-purity aluminum material is set to 1 at % or greater, the metal layer and the heat sink are subjected to solid-phase diffusion bonding, and wherein in a state in which the metal layer and the heat sink are laminated, and a load of 0.3 MPa to 3.0 MPa is applied to the resultant laminated body in a lamination direction, the laminated body is retained at a temperature that is equal to or higher than 90% of a solidus temperature (K) of the low-purity aluminum material and is lower than the solidus temperature of the low-purity aluminum material for 1 hour or longer to subject the metal layer and the heat sink to the solid-phase diffusion bonding.

2. The method for manufacturing a power module substrate with heat sink according to claim 1, wherein the high-purity aluminum material and the low-purity aluminum material contains one kind or two or more kinds of elements selected from Si, Cu, Mn, Fe, Mg, Zn, Ti, and Cr as the contained element other than Al, and a difference between a total amount of the contained element other than Al in the high-purity aluminum material and a total amount of the contained element other than Al in the low-purity aluminum material is set to 1 at % or greater.

3. The method for manufacturing a power module substrate with heat sink according to claim 2, wherein the low-purity aluminum material contains one kind or two or more kinds of elements selected from Si, Cu, Mn, Fe, Mg, Zn, Ti, and Cr in a total amount of 1 at % or greater, the amount of Si contained is set to 15 at % or less, the amount of Cu contained is set to 10 at % or less, the amount of Mn contained is set to 2 at % or less, the amount of Fe contained is set to 1 at % or less, the amount of Mg contained is set to 5 at % or less, the amount of Zn contained is set to 10 at % or less, the amount of Ti contained is set to 1 at % or less, and the amount of Cr contained is set to 1 at % or less.

4. The method for manufacturing a power module substrate with heat sink according to claim 2,
wherein in a state in which the metal layer and the heat sink are laminated, and a load of 0.3 MPa to 3.0 MPa is applied to the resultant laminated body in a lamination direction, the laminated body is retained at a temperature that is equal to or higher than 90% of a solidus temperature (K) of the low-purity aluminum material and is lower than the solidus temperature of the low-purity aluminum material for 1 hour or longer to subject the metal layer and the heat sink to the solid-phase diffusion bonding.

5. The method for manufacturing a power module substrate with heat sink according to claim 1,
wherein the low-purity aluminum material contains one kind or two or more kinds of elements selected from Si, Cu, Mn, Fe, Mg, Zn, Ti, and Cr in a total amount of 1 at % or greater, the amount of Si contained is set to 15 at % or less, the amount of Cu contained is set to 10 at % or less, the amount of Mn contained is set to 2 at % or less, the amount of Fe contained is set to 1 at % or less, the amount of Mg contained is set to 5 at % or less, the amount of Zn contained is set to 10 at % or less, the amount of Ti contained is set to 1 at % or less, and the amount of Cr contained is set to 1 at % or less.

6. The method for manufacturing a power module substrate with heat sink according to claim 5,
wherein in a state in which the metal layer and the heat sink are laminated, and a load of 0.3 MPa to 3.0 MPa is applied to the resultant laminated body in a lamination direction, the laminated body is retained at a temperature that is equal to or higher than 90% of a solidus temperature (K) of the low-purity aluminum material and is lower than the solidus temperature of the low-purity aluminum material for 1 hour or longer to subject the metal layer and the heat sink to the solid-phase diffusion bonding.

* * * * *